(12) United States Patent
Yamate et al.

(10) Patent No.: US 7,076,317 B2
(45) Date of Patent: Jul. 11, 2006

(54) METHOD FOR MANUFACTURING SEMICONDUCTOR DEVICE

(75) Inventors: Yuuki Yamate, Chitose (JP); Shuuetsu Yoshino, Nanae (JP); Toshimichi Suzuki, Hakodate (JP); Naohiro Hirai, Hakodate (JP)

(73) Assignees: Renesas Technology Corp., Tokyo (JP); Renesas Northern Japan Semiconductor, Inc., Hokkaido (JP)

( * ) Notice: Subject to any disclaimer, the term of this patent is extended or adjusted under 35 U.S.C. 154(b) by 208 days.

(21) Appl. No.: 10/480,295

(22) PCT Filed: Jun. 14, 2001

(86) PCT No.: PCT/JP01/05052

§ 371 (c)(1),
(2), (4) Date: Dec. 11, 2003

(87) PCT Pub. No.: WO02/103763

PCT Pub. Date: Dec. 27, 2002

(65) Prior Publication Data

US 2004/0199281 A1   Oct. 7, 2004

(51) Int. Cl.
*G06F 19/00* (2006.01)
(52) U.S. Cl. .................................... 700/121
(58) Field of Classification Search ............ 700/121
See application file for complete search history.

(56) References Cited

U.S. PATENT DOCUMENTS 4,544,318 A * 10/1985 Nagatomo et al. .......... 198/346
5,549,716 A    8/1996 Takahashi et al. .......... 29/25.01
6,931,298 B1 *  8/2005 Chang ....................... 700/121

FOREIGN PATENT DOCUMENTS

| JP | 61-47646    | 3/1986 |
| JP | 5-55279     | 3/1993 |
| JP | 5-63007     | 3/1993 |
| JP | 7-237095    | 9/1995 |
| JP | 8-181184    | 7/1996 |
| JP | 9-17836     | 1/1997 |
| JP | 11-145022   | 5/1999 |
| JP | 2000-99111  | 4/2000 |

* cited by examiner

*Primary Examiner*—Leo Picard
*Assistant Examiner*—Ryan A. Jarrett
(74) *Attorney, Agent, or Firm*—Miles & Stockbridge P.C (57) ABSTRACT

A flagship line 1 includes a job shop environment and a flow shop environment where three different standalone processing apparatuses for different steps constitute the job shop environment and two different serial processing apparatuses constitute the flow shop environment. One of the two serial processing apparatuses as a first serial processing apparatus 8 consists of a die bonder 5, a clean cure unit 6, and a wire bonder 7 and sequentially performs die bonding, clean cure and wire bonding. The other or second serial processing apparatus 13 consists of a marking unit 9, a cutting unit 10, a testing unit 11, and a visual inspection unit 12 and sequentially performs marking, lead cutting, testing, and visual inspection. The three standalone processing apparatuses are a dicing apparatus 2, a molding apparatus 4, and a visual inspection apparatus 3. This not only minimizes the possibility of a stagnant flow of workpieces between steps but also substantially shortens the overall processing time.

10 Claims, 12 Drawing Sheets

METHOD FOR MANUFACTURING SEMICONDUCTOR DEVICE

TECHNICAL FIELD

The present invention relates to semiconductor device manufacturing techniques and more particularly to techniques which are useful for a semiconductor device manufacturing method using a serial processing apparatus and a workpiece flow management system.

BACKGROUND ART

There are two types of semiconductor device manufacturing systems: a job shop system and a flow shop system. In a job shop system, plural semiconductor device manufacturing apparatuses of a kind are installed for each step to assure a high operation rate. In a flow shop system, a series of different steps are connected in a serial processing apparatus so that the different steps are serially performed. (As a compromise between both, a modular system is also available.)

Semiconductor device manufacturing techniques for job shop process systems are disclosed in Japanese Unexamined Patent Publication No.181184/1996 and No. 237095/1995.

Japanese Unexamined Patent Publication No.181184/1996 describes a technique for a job shop process system in which workpiece conveyance and processing are carried out between processing apparatuses under design cycle time control and workpieces are freely conveyed between processing apparatuses.

Japanese Unexamined Patent Publication No.237095/1995 describes a technique for a job shop process system in which there are plural working areas in each of which plural processing apparatuses of a kind are connected by a conveyor system, and workpieces are moved between processing apparatuses as if they were moved between several flow shops.

Among other related techniques is a technique disclosed by Japanese Unexamined Patent Publication No.145022/1999 which combines flow shop and job shop manufacturing lines to perform various steps efficiently. In this system, among a series of manufacturing steps, some steps suitable for a flow shop system are arranged according to a flow shop layout and the other steps are arranged according to a job shop layout.

Furthermore, Japanese Unexamined Patent Publication No.99111/2000 describes a production control technique which is related to priority-based lot management. In this technique, a comparison is made in absolute priority between products in process and incoming products to determine which products should be processed next.

However, the above-mentioned techniques do not include reference to means to optimize the selection of processing apparatuses for prioritized/non-prioritized products, optimize the selection of processing apparatuses for mass-produced products/small-lot products or differentiate process scheduling.

Besides, there is no reference to means to save labor required to rearrange the processing line for product type change or in case of a system failure, by using a loader unit effectively in a flow shop system (serial processing system).

An object of the present invention is to provide a semiconductor device manufacturing method which substantially shortens the processing time.

The above and other objects and novel features of the invention will be apparent from the following description taken in connection with the accompanying drawings.

DISCLOSURE OF THE INVENTION

The present invention provides a method of manufacturing a semiconductor device having a manufacturing sequence including: a flow shop process of sequentially performing a series of plural different steps; and a job shop process of providing a plurality of processing apparatuses of a kind and concurrently performing processing of different conditions, wherein a process of the manufacturing sequence, at least either flow shop process or job shop process is performed and the manufacturing sequence combines flow shop process and job shop process.

Furthermore, the present invention provides a method of manufacturing a semiconductor device having a manufacturing sequence including: a flow shop process of sequentially performing a series of plural different steps; and a job shop process of providing a plurality of processing apparatuses of a kind and concurrently performing processing of different conditions, wherein in a process in the manufacturing sequence, either flow shop process or job shop process or both are performed, and the manufacturing sequence combines flow shop process and job shop process, and a serial processing apparatus having at least one loader unit is used for flow shop process.

BRIEF DESCRIPTION OF THE DRAWINGS

FIG. 9($a$) and FIG. 9($b$) show other application examples of the first serial processing apparatus in the flagship line shown in FIG. 1;

BEST MODE FOR CARRYING OUT THE INVENTION

Basically, in the explanation of an embodiment given below, descriptions of equivalent or similar elements will not be repeated A plurality of inventions will be described below in connection with an embodiment for the sake of simplicity, but it is obvious that every step is not essential for all inventions unless otherwise specified.

In the explanation of an embodiment given below, descriptions will be made separately of more than one section or embodiment when necessary. However, these descriptions are not irrelevant to each other unless otherwise specified; a description of one section or embodiment may be, in part or in whole, a variation or a detailed or supplementary version of description of another.

In the explanation of an embodiment given below, even when a specific numeric figure for an element (number of pieces, numeric value, quantity, range, etc.) is indicated, the element is not limited thereto unless otherwise specified or theoretically limited thereto, and its actual quantity or other numeric data may be above or below the indicated specific figure.

In the explanation of an embodiment given below, it is obvious that its elements (including steps) are not always essential unless otherwise specified or considered theoretically essential.

In the explanation of an embodiment given below, when the form or position of an element is indicated, any other form or position virtually equivalent or similar to it is acceptable unless otherwise specified or the form or position should be theoretically as indicated. The same can be true of the above-mentioned numeric data or range.

Next, a preferred embodiment of the present invention will be described in detail referring to the accompanying drawings. In the drawings, components with the same functions are designated with the same reference numerals and their descriptions will not be repeated.

Figure 12:
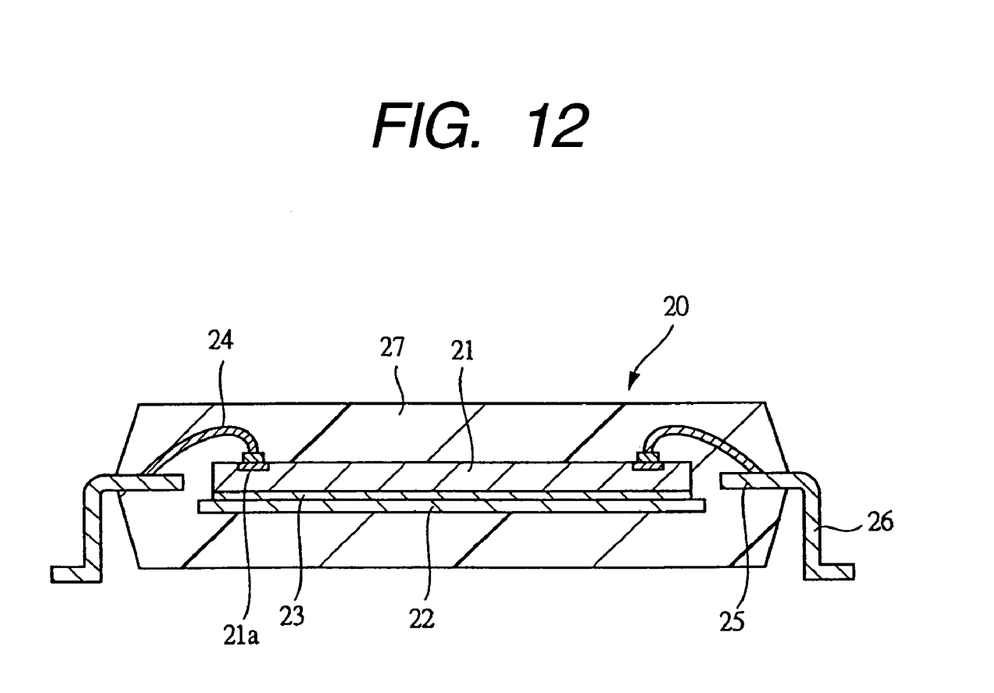
FIG. 12 is a sectional view showing an example of a product QFP assembled in the manufacturing process shown in FIG. 11.

This embodiment concerns a manufacturing line for semiconductor device assembly. Here, QFP (Quad Flat Package) 20 as shown in FIG. 12 is taken as an example of a semiconductor device. A flagship line 1 (FIG. 1) as a manufacturing line for the QFP 20 will be explained.

Figure 11:
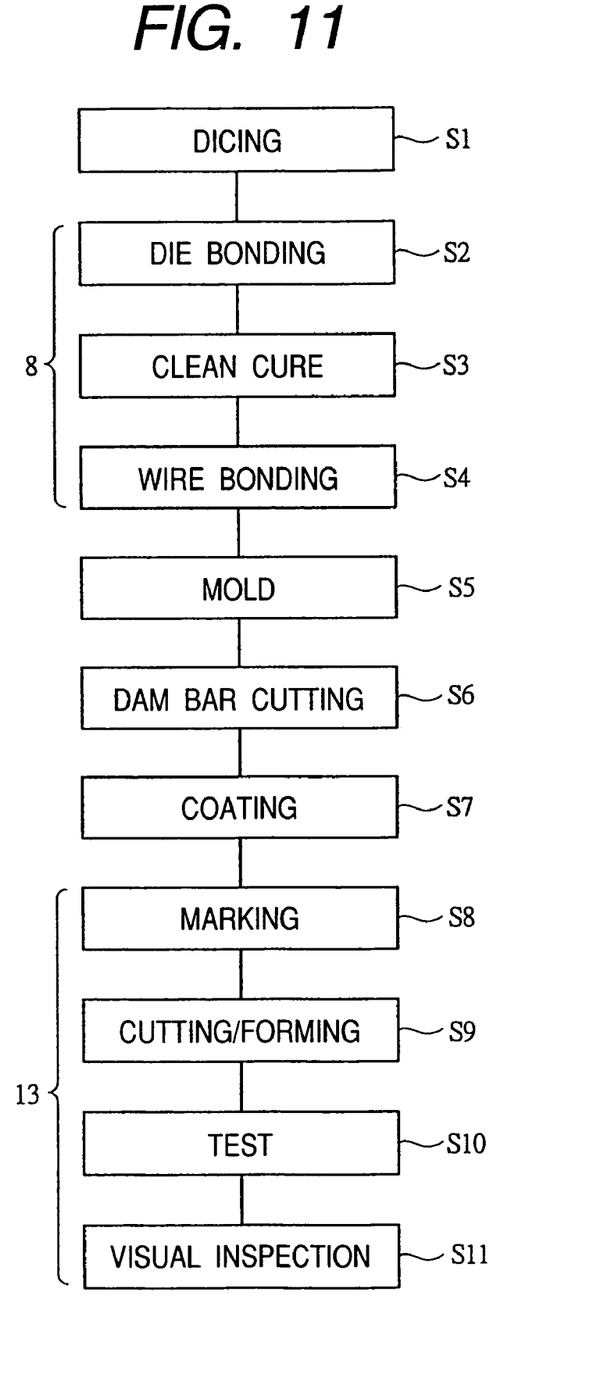
FIG. 11 is a manufacturing process flow diagram showing an example of an assembling process in the flagship line shown in FIG. 1.

The flagship line 1 includes various processing apparatuses (manufacturing machines) which match a manufacturing process flow shown in FIG. 11.

Figure 1:
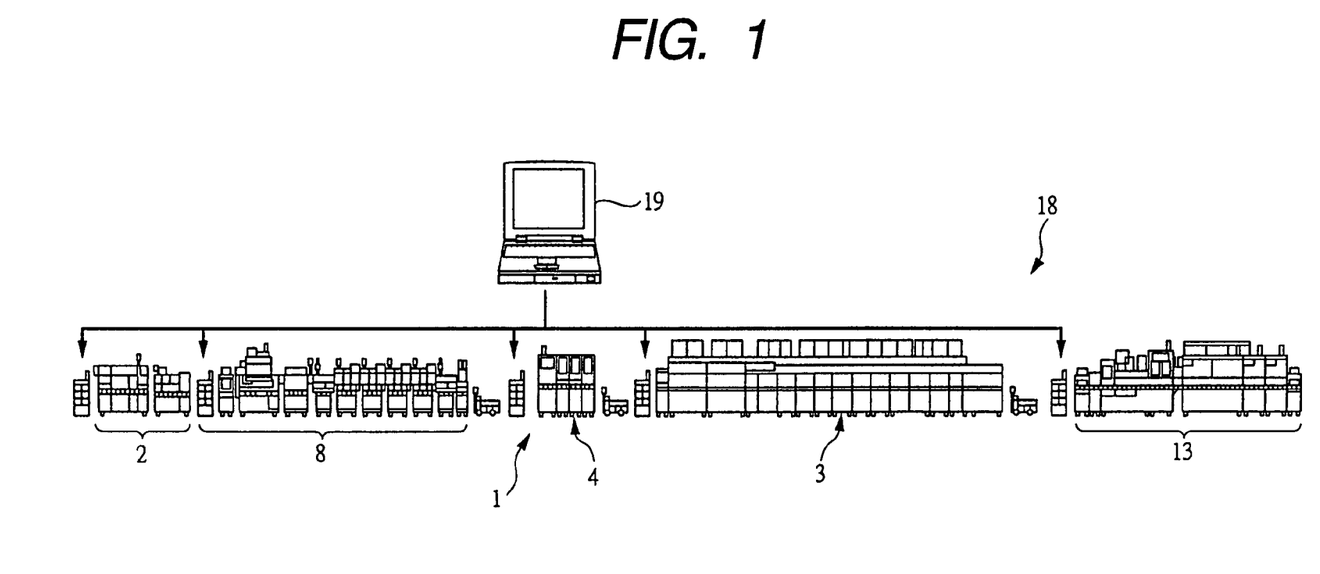
FIG. 1 shows the general structure of a flagship line based on a semiconductor device manufacturing method as an embodiment of the present invention.
Figure 5:
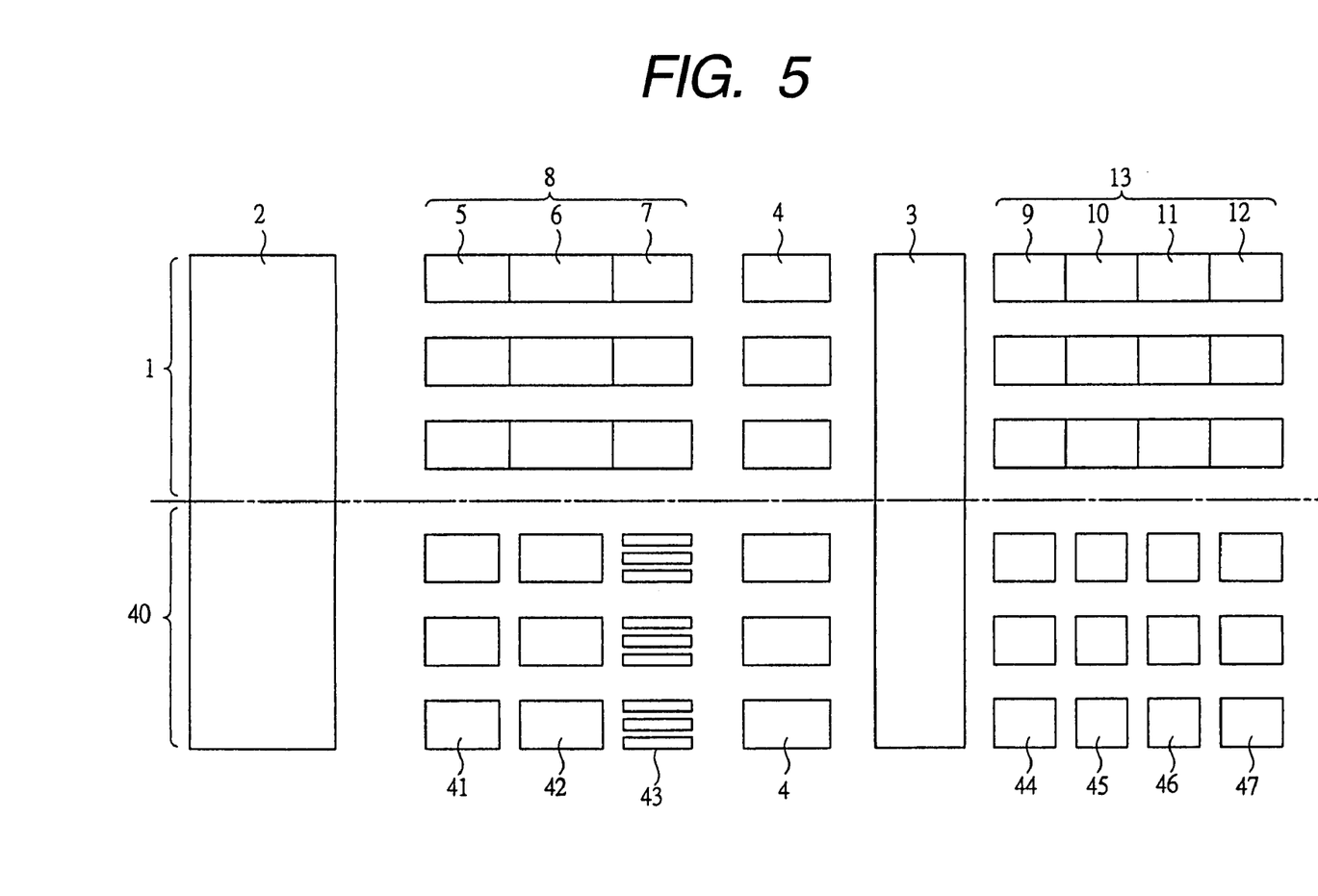
FIG. 5 shows an example of a line which combines the flagship line shown in FIG. 1 and an existing line.

A major feature of the flagship line 1 is that it includes serial processing apparatuses, namely it combines serial processing apparatuses with plural standalone processing apparatuses. The manufacturing line as shown in FIG. 1 and FIG. 5 according to this embodiment includes two different serial processing apparatuses and three different standalone processing apparatuses where the two different serial processing apparatuses each carry out flow shop process while job shop process is carried out between the two serial processing apparatuses.

In other words, the three different standalone apparatuses are installed to perform their respective steps in a job shop environment and the two different serial processing apparatuses are installed in a flow shop environment.

A job shop means a production process in which plural processing apparatuses of a kind are located in one place to assure a high operation rate.

A flow shop means a production process in which a series of different steps are sequentially performed.

In the flagship line 1 shown in FIG. 1 and FIG. 5, a first serial processing apparatus 8, which is one of the above two serial processing apparatuses, consists of a die bonder 5, a clean cure unit 6, and a wire bonder 7 which are connected to perform die bonding, clean cure and wire bonding sequentially (flow shop process).

The other or second serial processing apparatus 13 consists of a marking unit 9, a cutting unit 10, a testing unit 11, and a visual inspection unit 12 which are connected to perform marking, lead cutting, testing, and visual inspection sequentially.

The three standalone processing apparatuses (job processing apparatuses) are respectively a dicing apparatus 2, a molding apparatus 4 and a coating apparatus 3.

These apparatuses are used to take different steps as shown FIG. 11 to assemble the QFP 20 (FIG. 12). The steps are semiconductor wafer dicing (step S1), die bonding (step S2), clean cure (step S3), wire bonding (step S4), molding (step S5), coating (step S7), marking (step S8), cutting/forming (step S9), testing (step S10), and visual inspection (step S11).

Particularly in assembling the QFP 20 (narrow pitch type) according to this embodiment, the step of dam bar cutting (step S6) is taken for lead frames before the step of coating (step S7).

The step of dam bar cutting may be performed during lead cutting work at the step of lead cutting/forming (step S9).

The flagship line 1 in this embodiment shares some processing apparatuses with an existing line 40, as illustrated in FIG. 5.

For example, the dicing apparatus 2 and the coating apparatus 3 have far larger capacities than the other processing apparatuses and are capable of coping with different product types, so their reserved capacities are used for the existing line 40.

Although the molding apparatus 4 is used for the job shop process, its processing capacity should differ depending on the number of products per mold and thus it is not shared with the existing line 40 in this case.

As shown in FIG. 5, in addition to the dicing apparatus 2 and coating apparatus 3 shared with the flagship line 1, the existing line 40 includes standalone molding apparatuses 4, standalone die bonders 41, standalone clean cure units 42, standalone wire bonders 43, standalone marking units 44, standalone cutting units 45, standalone testing units 46, and standalone visual inspection units 47.

Figure 6:
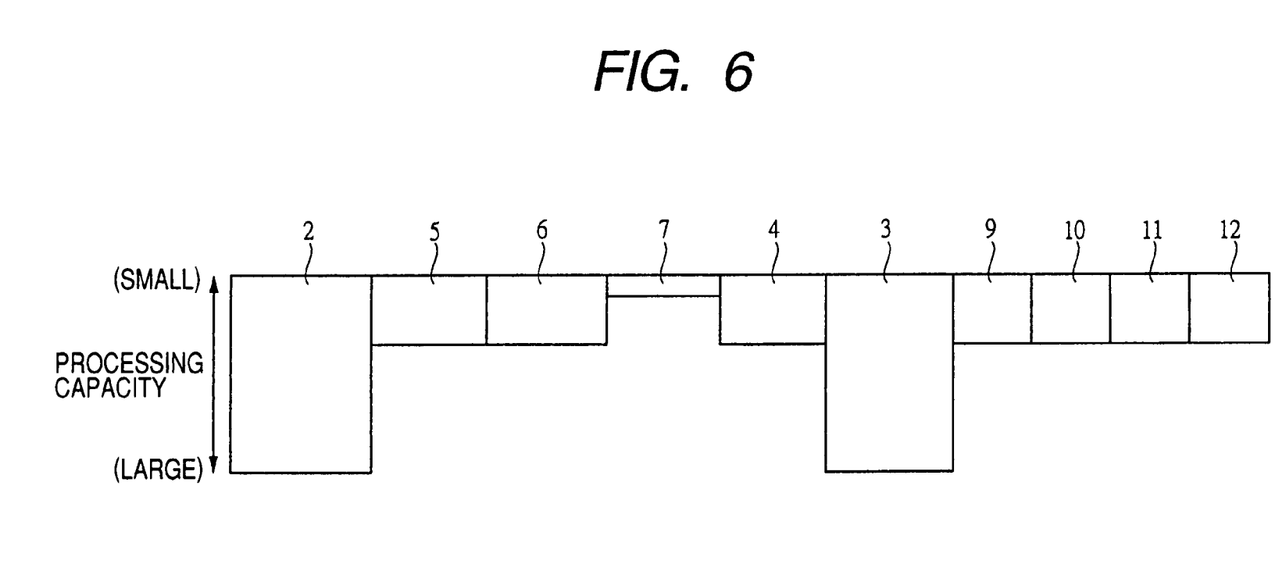
FIG. 6 is a processing capacity comparison diagram showing different processing capacities of different processing apparatuses in the flagship line shown in FIG. 5.

In each of the first serial processing apparatus 8 and the second serial processing apparatus 13, their constituent processing apparatuses are similar in processing capacity as shown in FIG. 6.

If apparatuses with different processing capacities should be simply integrated into one serial processing apparatus for flow shop process, a processing apparatus with a low processing capacity (the wire bonder 7 in this case; see FIG. 6) would determine the overall processing capacity of the integrated or serial processing apparatus and an apparatus with a higher processing capacity (the dicing apparatus 2 and the coating apparatus 3 in this case) could not be effectively used.

Therefore, in order to take full advantage of the high capacities of the dicing apparatus 2 and coating apparatus 3, they are independent from the serial processing apparatuses and shared with the existing job shop line.

Also, the molding apparatus 4, the processing capacity of which should differ depending on the number of products per mold as specified for each product type, is independent from the serial processing apparatuses so that processing capacity discrepancy in the serial processing apparatuses can be avoided even when the product type is changed.

In the serial processing apparatus which consists of the die bonder 5, clean cure unit 6 and wire bonder 7, plural wire bonders 7 (which has a low processing capacity) may be installed to balance the processing capacities of different steps.

Thus, the flagship line 1 in this embodiment uses serial processing apparatuses which combine processing units with similar processing capacities.

The QFP 20 as an example of a semiconductor device to be assembled by the flagship line 1 will be explained next (see FIG. 12). The device comprises: a semiconductor chip 21 which bears a semiconductor integrated circuit on its main surface; a tab 22 to which the semiconductor chip is fixed; die bond 23 which joins the semiconductor chip 21 to the tab 22; plural metal wires 24 which electrically connect an electrode pad 21a on the main surface of the semiconductor chip 21 with a corresponding inner lead 25; plural outer leads 26 which are integrally joined with the inner lead 25 and function as external terminals; and a plastic mold 27 which molds the semiconductor chip 21 and wires 24 with mold resin, where the outer leads 26 are bent into a gull wing shape outside the plastic mold 27.

Figure 2:
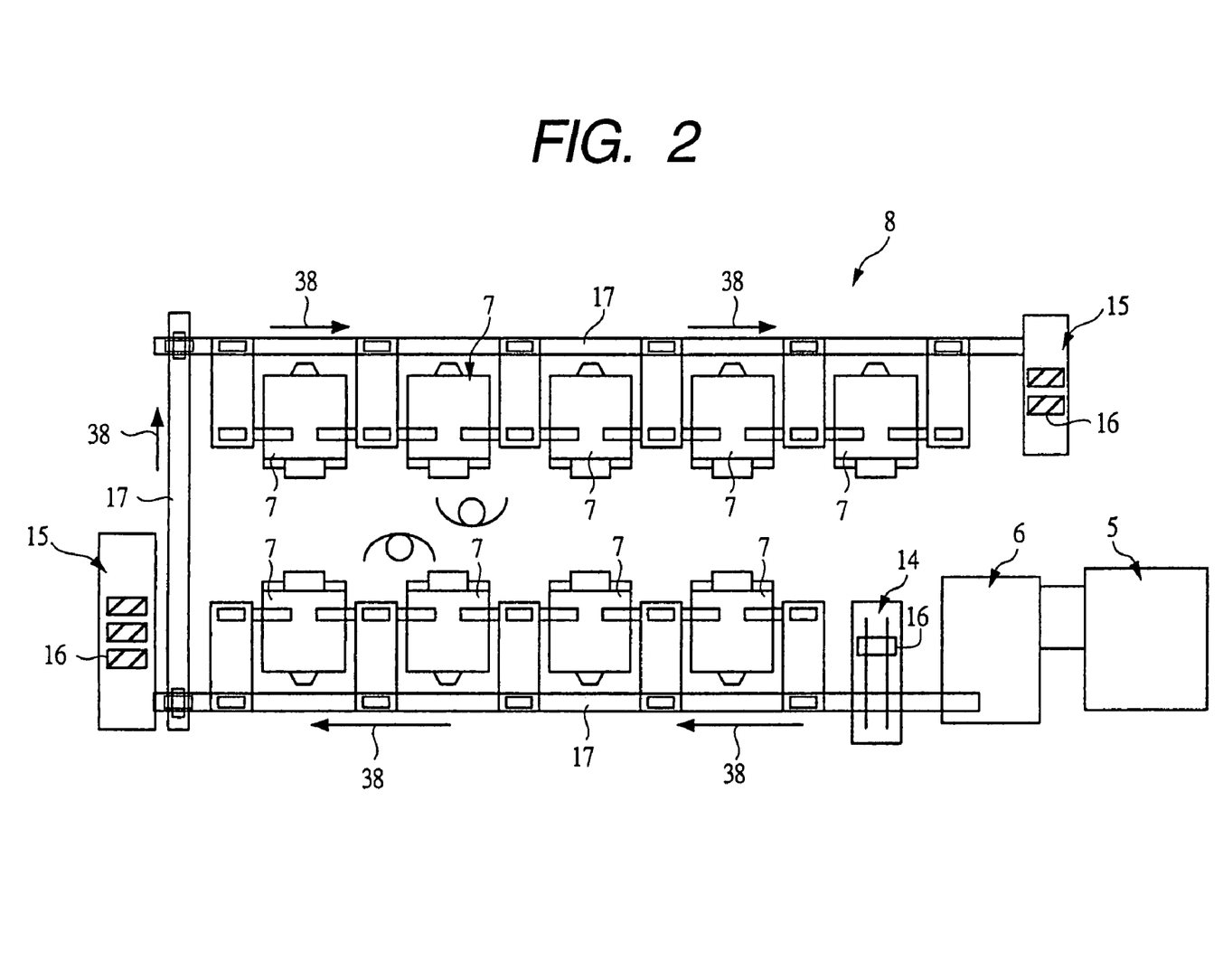
FIG. 2 shows the structure of a first serial processing apparatus in the flagship line shown in FIG. 1.
Figure 3:
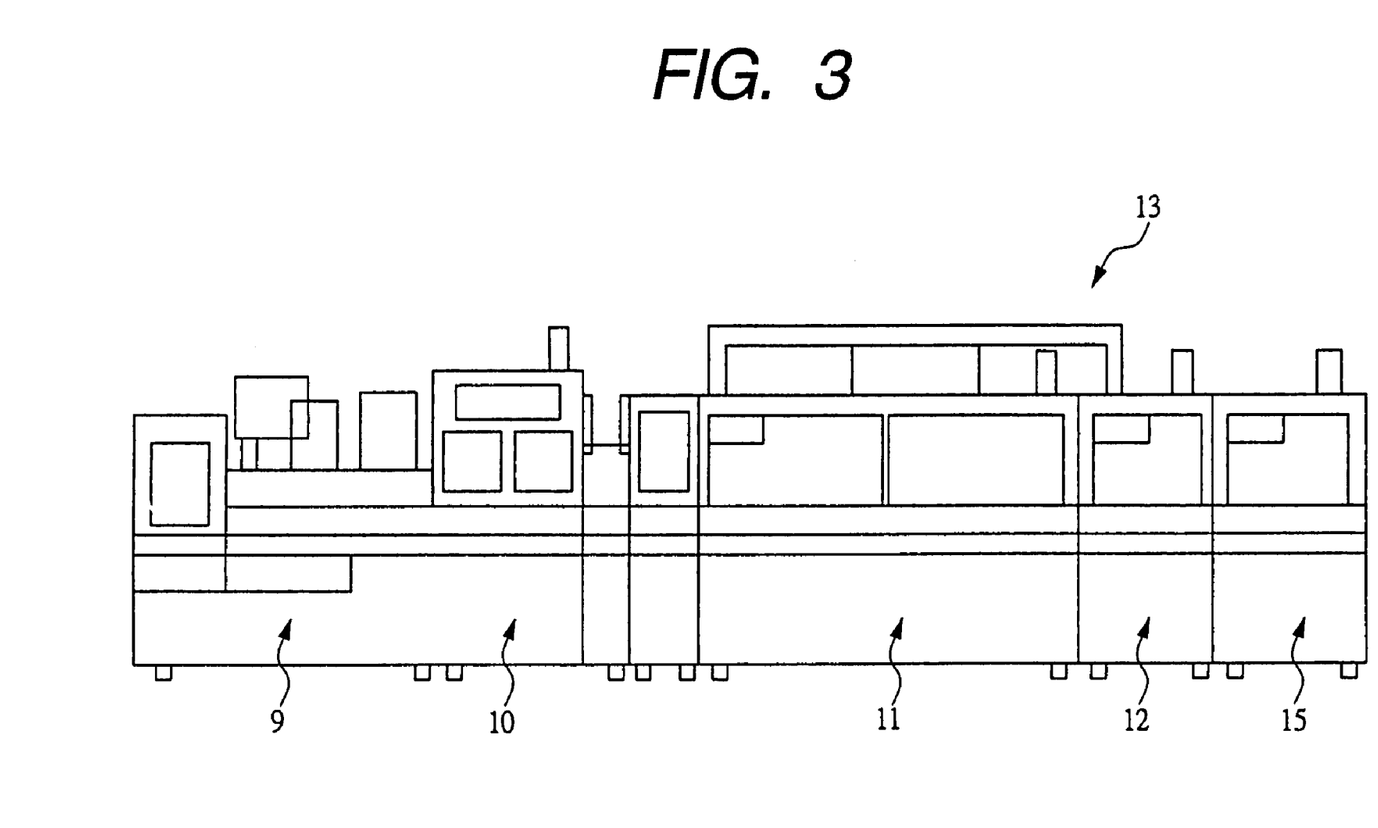
FIG. 3 shows the structure of a second serial processing apparatus in the flagship line shown in FIG. 1.

Next, the first serial processing apparatus 8 and the second serial processing apparatus 13 will be described in detail.

As shown in FIG. 2, the first serial processing apparatus 8 comprises a die bonder 5, a clean cure unit 6, and wire bonders 7 (for example, one die bonder, one clean cure unit 6, and nine wire bonders 7), and a frame as a workpiece to be processed is carried by a frame conveyor line 17.

The number of wire bonders is not limited; it should depend on the number of outer leads (external terminals) 26 of the QFP 20. It is also possible to use a plurality of die bonders 5 or a plurality of clean cure units 6. The numbers of die bonders 5 and clean cure units 6 should also depend on the number of outer leads 26 of the QFP 20. The numbers of die bonders 5, clean cure units 6 and wire bonders 7 should be determined so that their processing capacities are balanced.

The first serial processing apparatus 8 should be able to be prepared quickly to run independently. The frame conveyor line 17 should not be monolithic but should consist of several blocks whenever possible. It lies behind the wire bonders 7 so that it can be rearranged to cope with change in the number of wire bonders 7 or the layout.

The conveyor line need not be readjusted while a group of lead frames is being processed.

In the first serial processing apparatus 8, a loader unit 14 lies between the clean cure unit 6 and the wire bonders. When a frame is loaded from the clean cure unit 6 into the loader unit 14, the frame is placed in a magazine 16.

In other words, the die bonder 5 and the clean cure unit 6 process frames on a frame-by-frame basis; then, when moving frames from the clean cure unit 6 into the loader unit 14, they are placed in the magazine 16 before being loaded in to the loader unit 14.

The wire bonders 7 receive the magazine and take out the frames from the magazine 16 to perform wire bonding on them.

In the first serial processing apparatus 8, an unloader unit 15 is provided at the line end and also another unloader unit 15 (intermediate unloader unit) is provided between two neighboring wire bonders 7.

In other words, in the first serial processing apparatus 8, there are plural unloader units 15 including the intermediate unloader unit located halfway in the row of wire bonders and the number of unloader units 15 is smaller than the number of wire bonders 7.

The presence of the intermediate unloader unit 15 located halfway in the row of wire bonders means that frames can be unloaded there and sent to the molding apparatus 4.

Thus, in the first serial processing apparatus 8 according to this embodiment, frames as workpieces to be processed can be unloaded by the unloader units 15 located at two places.

This makes it possible to adjust the design cycle time among the die bonder 5, clean cure unit 6 and wire bonders 7 to increase the operation rate of the first serial processing apparatus 8 and improve throughput.

Figure 9:
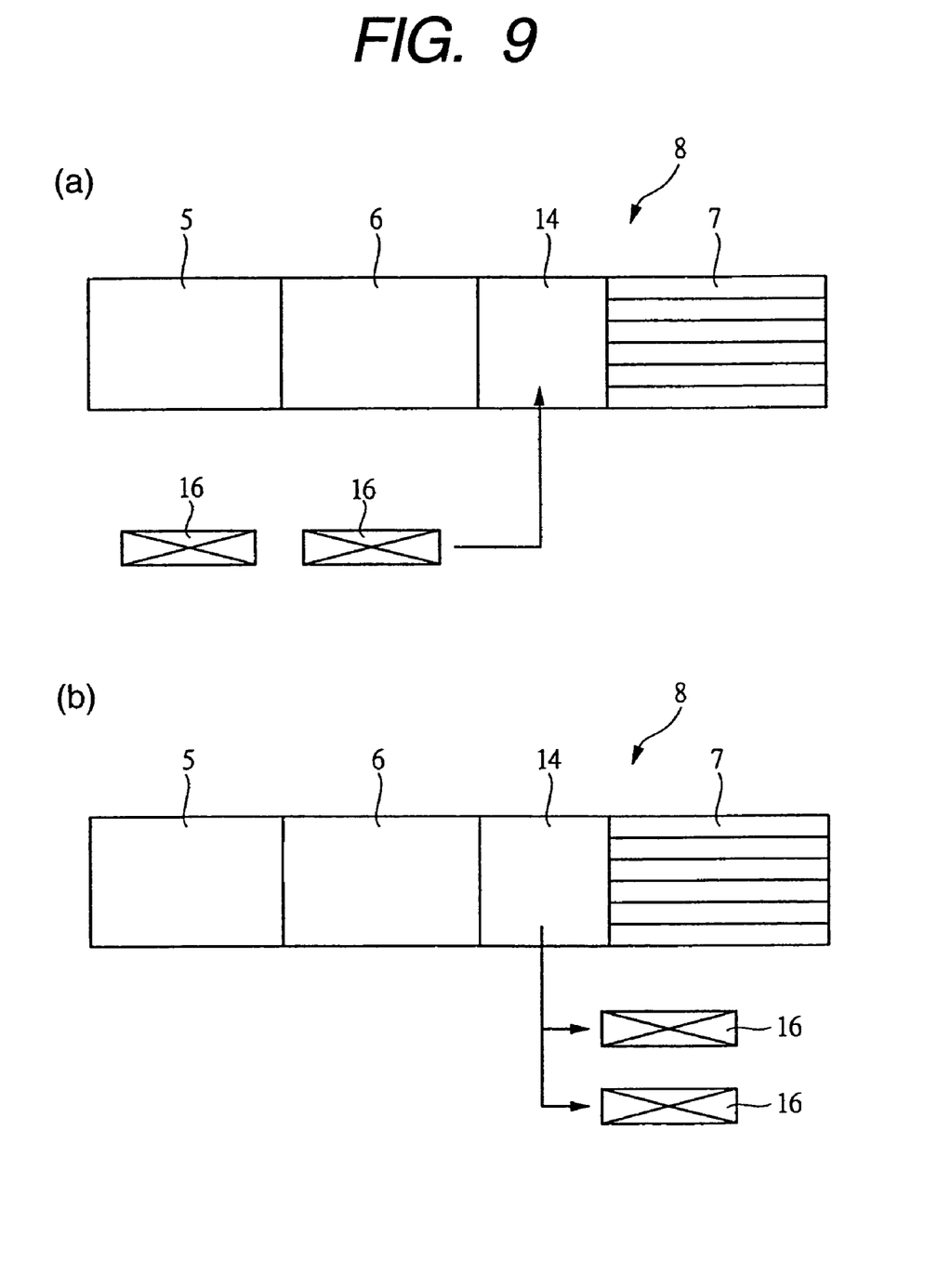

As illustrated in FIG. 9(a), the magazines which house frames can be loaded halfway in the row of wire bonders, and also as illustrated in FIG. 9(b), the magazines which contain frames can be unloaded halfway in the row of wire bonders. Therefore, if a problem occurs in the die bonder 5 or clean cure unit 6, the operation rate of the first serial processing apparatus 8 will not decline.

Since the processing capacities of the die bonder 5 and the clean cure unit 6 are higher than the processing capacity of the wire bonders 7, frames (magazines) may accumulate in the loader unit 14. In such a case, the magazines which house frames can be unloaded halfway in the row of wire bonders so that wire bonding can be done on the frames by standalone wire bonders 43 independent from the first serial processing apparatus 8, as shown in FIG. 5.

Therefore, it is possible that mass-produced products (main products) and urgently needed products are preferentially processed by the first serial processing apparatus 8 and other products are first subjected to the steps of clean cure in the first serial processing apparatus 8 and then wire bonding is performed by the standalone wire bonders 43.

This means that the first serial processing apparatus 8 may also be used as a standalone wire bonder and also as a combination apparatus for die bonding and clean cure.

As illustrated in FIG. 2, in the first serial processing apparatus 8 with plural wire bonders 7, it is a prerequisite that the number of wire bonders located after the intermediate unloader unit 15 or remoter from the clean cure unit in the frame conveying direction 38 is larger than the number of wire bonders 7 between the clean cure unit 6 and the intermediate unloader unit 15.

In this embodiment, five of the nine wire bonders 7 are located after the intermediate unloader unit 15 or remoter from the clean cure unit and the remaining four wire bonders 7 are located between the clean cure unit 6 and the intermediate unloader unit 15. That is, the number of the remoter wire bonders 7 (located after the intermediate unloader unit 15) is one larger the number of the nearer wire bonders 7.

This means that preparations or initial setup for a next product type can be started on the nearer four wire bonders 7 between the loader unit 14 and the intermediate unloader unit 15 as the last workpiece (frame) passes through the intermediate unloader unit 15.

Consequently, the number of loader units 14 and the number of unloader units 15 may be decreased to improve throughput and reduce the cost of the manufacturing line.

It is also possible that the nearer four wire bonders (between the clean cure unit 6 and the intermediate unloader unit 15) and the remoter five wire bonders (between the intermediate unloader unit 15 and the end unloader unit 15) carry out wire bonding on different types of workpieces (frames) concurrently.

Furthermore, in the first serial processing apparatus 8, frames can be accumulated on the frame conveyor line 17.

Next, the second serial processing apparatus 13 as shown in FIG. 3 is described.

The second serial processing apparatus 13 comprises a marking unit 9, a cutting unit 10, a testing unit (which also serves as a handler) 11, a visual inspection unit 12, and an unloader unit 15. It sequentially performs the following steps (flow shop process): marking, cutting, testing and visual inspection.

Figure 4:
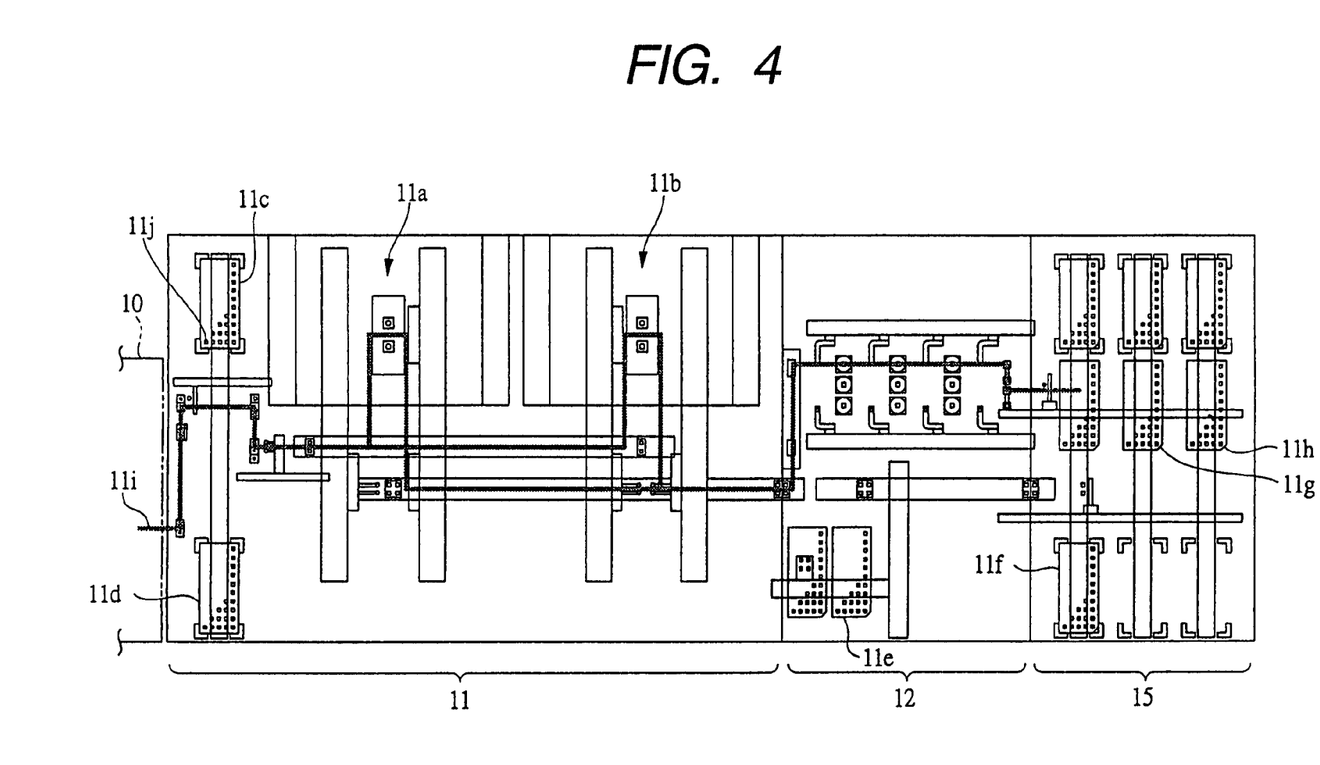
FIG. 4 is a top view showing the detailed structures of a testing unit and a visual inspection unit in the second serial processing apparatus shown in FIG. 3.

In the second serial processing apparatus 13 (FIG. 3) according to this embodiment, two test heads can be mounted in the testing unit 11 as shown in FIG. 4.

In the testing unit 11 (handler), testing can be made using two test heads (a first test head 11a and a second test head 11b).

The processing capacities of the marking unit 9 and the cutting unit 10 are preset so that two QFPs are processed, for example, in 2.5 seconds and the capacities for handling and visual inspection are preset to match them.

In the second serial processing apparatus 13 (FIG. 3), marking is first done by the marking unit 9, then lead cutting is done by the cutting unit 10 to make separate chips, and the separate chips or devices 11j are carried into the testing unit 11 through a workpiece flow path 11j.

In the testing unit 11, devices 11j which are carried and housed in a first tray 11c are tested (a defective device is marked with a cross) and devices marked with a cross on the surface of the plastic mold 27 (FIG. 12) are selected and housed in a second tray 11d. Devices 11j marked with a cross are devices which have been judged as defective at the wire bonding or molding step and carried into the testing unit 11. In the testing unit 11, such defective devices 11j are moved into the second tray 11d.

Then, two devices not marked with a cross are carried to each of the first test head 11a and the second test head 11b and these four devices 11j are simultaneously tested by the first test head 11a and the second test head 11b. Functional tests (for example, Function, DC, FT tests) are conducted on the four devices 11j with the two test heads for approximately five seconds.

Then, devices which have passed the functional tests are carried to the visual inspection unit 12 and measured in terms of marking, lead pitch and flatness. Devices 11j which have been rejected by the functional tests are moved into a sixth tray 11h for functionally defective devices.

Regarding devices 11j which have undergone a visual inspection, accepted devices are put in a fourth tray 11f and rejected or defective devices are put in a fifth tray 11g.

Thus, the fifth tray 11g is used for visually defective devices and the sixth tray 11h is used for functionally defective devices.

If the proportion of functionally defective devices is 3% or more and the proportion of visually defective devices is 1% or more, functionally defective ones and visually defective ones are respectively put in a second tray 11d and a third tray 11e and subjected to a visual inspection and functional testing again.

In order to match the processing capacity of the visual inspection unit 12 with that of the testing unit 11, images from the two lines are alternately picked up in carrying devices 11j.

Figure 10:
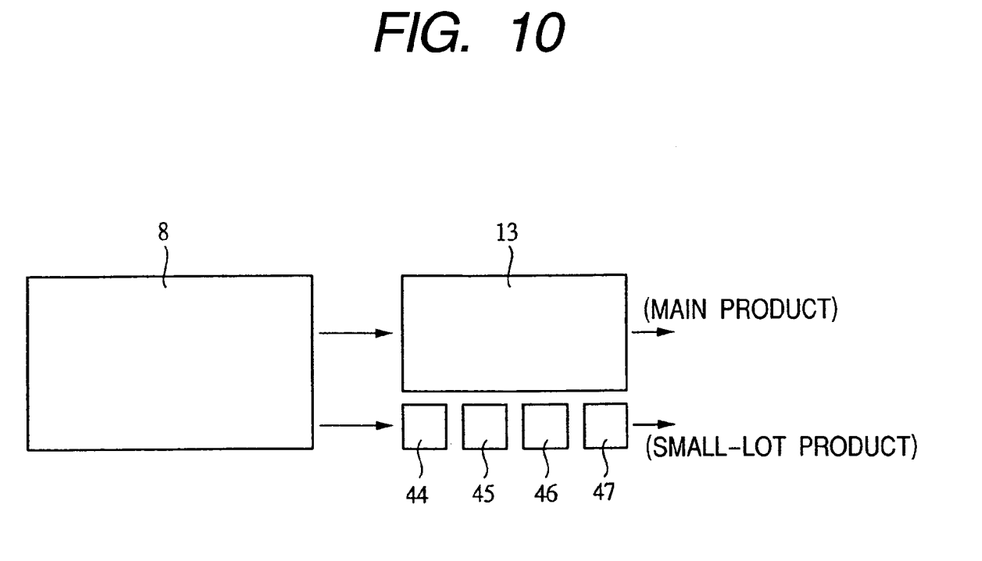
FIG. 10 show another application example of the flagship line shown in FIG. 1.

In the flagship line 1 according to this embodiment, the processing capacity of the first serial processing apparatus 8 (FIG. 2) is larger than that of the second serial processing apparatus 13 (FIG. 3), as illustrated in FIG. 10.

This is because processing time variation in the first serial processing apparatus 8 is smaller.

Therefore, as illustrated in FIG. 10, in the flagship line 1 according to this embodiment, it is also possible that while a main product (for example, a mass produced or core product) is processed in a flow shop line provided by the first serial processing apparatus 8 and the second serial processing apparatus 13, concurrently a small lot product is first processed in a flow shop line provided by the first serial processing apparatus 8 and then in a job shop line provided by a standalone marking unit 44, a standalone cutting unit 45, a standalone testing unit 46, and a standalone visual inspection unit 47.

In the testing unit 11, when test items are added and it takes longer time to test the main product, additional test heads may be used to test, for example, eight devices 11j at a time.

In this case, if it takes longer time to test a non-main product, devices (workpieces) may be processed not by the second serial processing apparatus 13 but in the job shop line.

Besides, in the second serial processing apparatus 13, if the marking unit 9 and the cutting unit 10 fail, it is possible to use only the testing unit 11; on the other hand, if the testing unit 11 fails, it is possible to use only the marking unit 9 and the cutting unit 10.

In the flagship line 1 according to this embodiment, the first serial processing apparatus 8 and second serial processing apparatus 13 (which constitute a flow shop line) are combined with the dicing apparatus 2, molding apparatus 4 and coating apparatus 3 (which constitute a job shop line) to perform the processing sequence as shown in FIG. 11 to assemble the QFP 20 (FIG. 12).

Referring to FIG. 1, a process start support system 18 which uses the flagship line 1 according to this embodiment is explained below.

In the process start support system 18, data from various steps of the flagship line 1 is sent to a host computer 19 and instructions for starting the manufacturing process for a new product, which are based on the data, are sent from the host computer 19 to various steps or processing apparatuses.

In other words, this is a management system which keeps track of workpieces to know which workpieces are in which step or in what condition and optimize the flow of workpieces.

Concretely, it has the following functions: to predetermine a work schedule; to give instructions for a product to be manufactured next; to estimate time of arrival of workpieces from the preceding step; to check the progress of the process and order the preceding step to start; to observe the overall process condition and order the step of wafer mounting/dicing as the initial step (step 1) to load a semiconductor wafer; to give an alarm to a stagnant flow of workpieces; to do first-in first-out management; to preannounce setup for a next product type and make workpieces in various steps flow smoothly, and so on.

Figure 8:
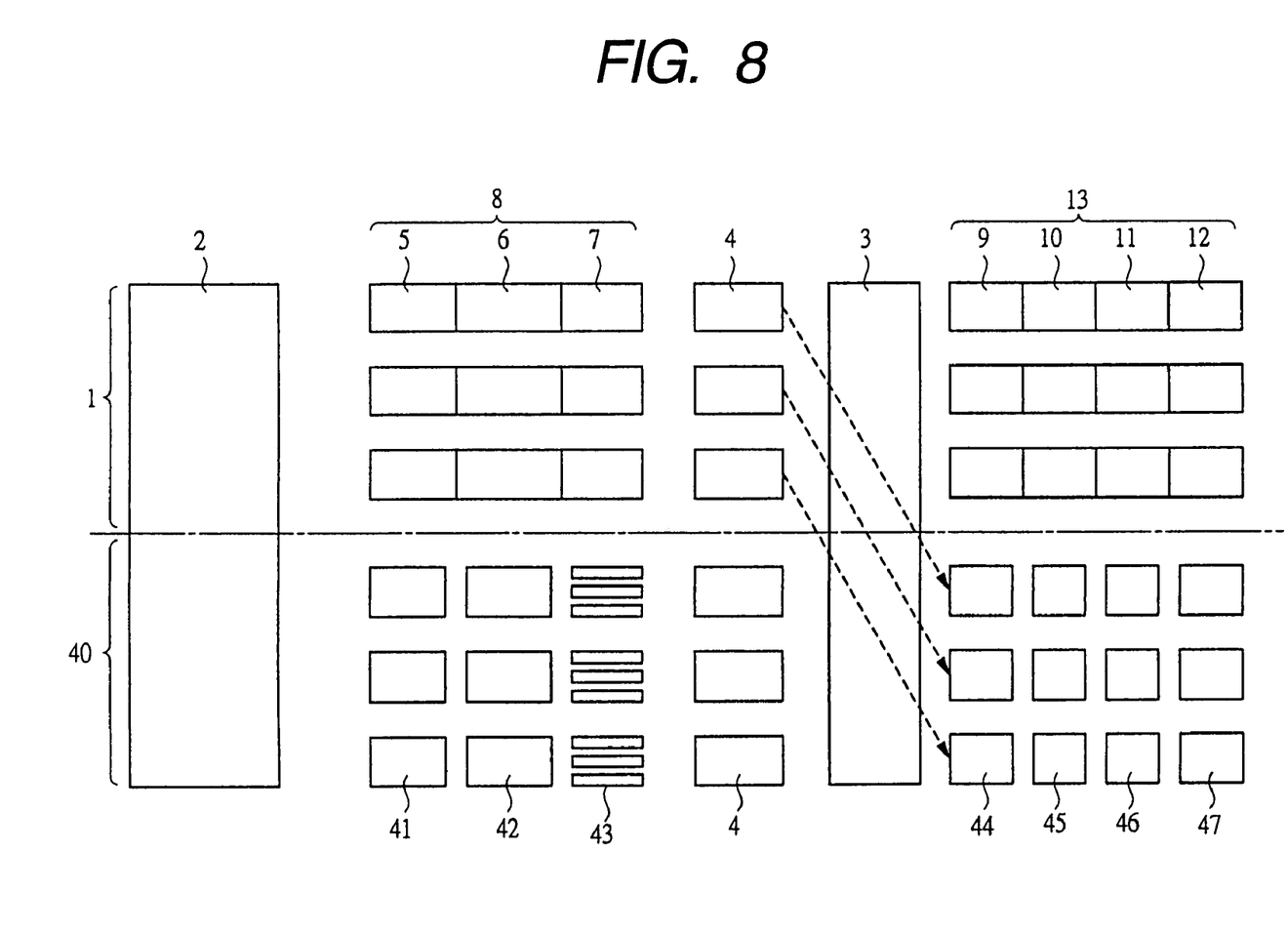
FIG. 8 shows an example of a workpieces flow in the offline mode in the combination line shown in FIG. 5.

FIG. 8 shows a case that a problem occurs in the second serial processing apparatus 13 and an instruction for offline operation is given. Here, the host computer 19 sends to a processing apparatus in the job shop line (for example, the standalone marking unit 44) an instruction to switch the ongoing flow shop process to an offline job shop process (in the existing line 40) so that the process goes on continuously or without halting the flagship line 1.

Figure 7:
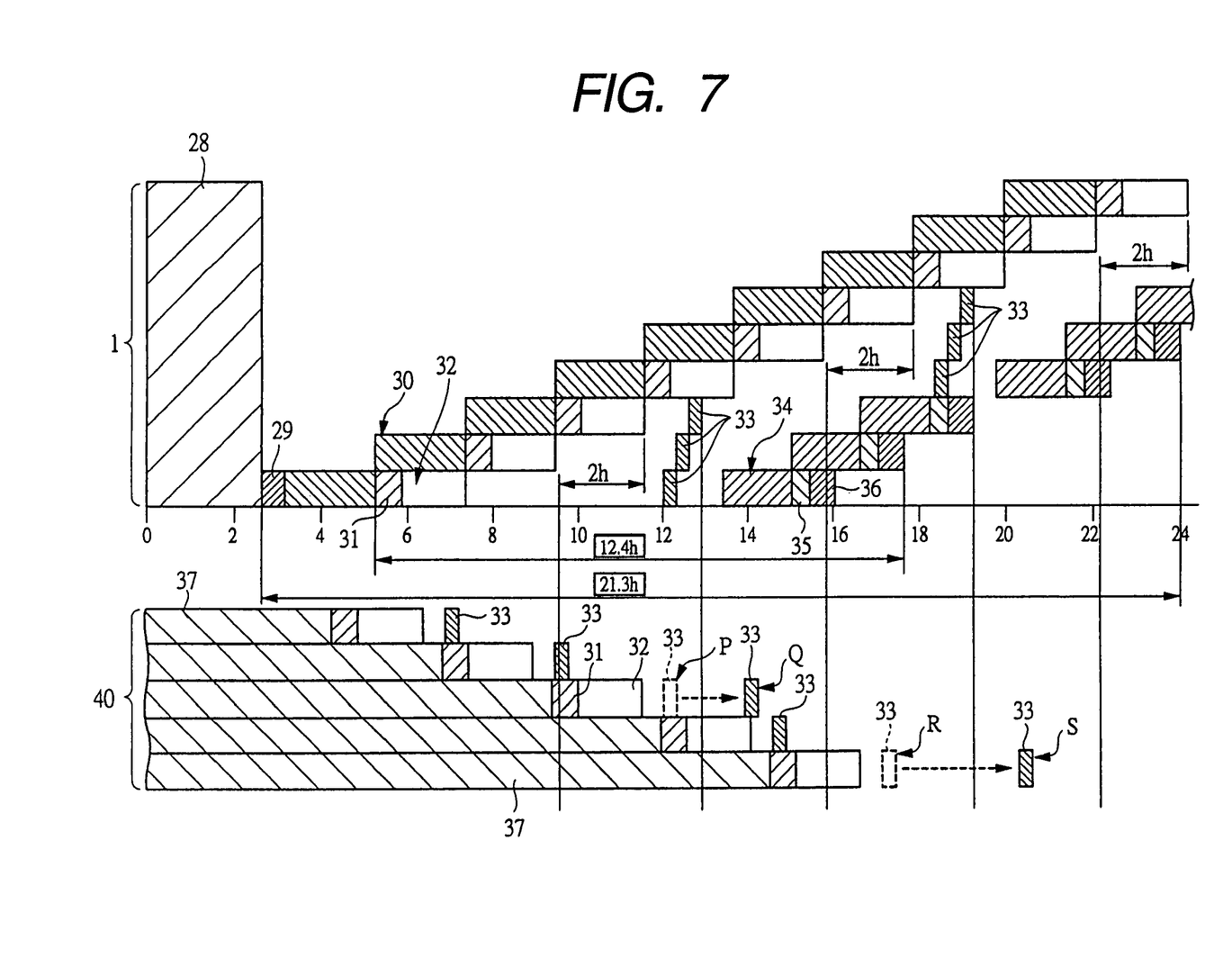
FIG. 7 is a scheduling diagram showing process time charts in the flagship and combination lines shown in FIG. 5.

FIG. 7 shows a work schedule which gives priority to the serial processing line. For example, an instruction to give priority to the serial process is sent from the host computer 19 to the coating apparatus 3.

FIG. 7 is a time chart showing a lot-by-lot schedule in a situation that the steps in the flagship line 1 and the steps in the job shop line (existing line 40) take place concurrently. In the flagship line 1, the following steps are performed sequentially: dicing 28, preparation for die bonding 29, first serial processing 30 by the first serial processing apparatus 8 (die bonding, clean cure, wire bonding), mold preparation 31, molding 32, coating 33, second serial processing 34 by the second serial processing apparatus 13 (marking, lead cutting, testing, visual inspection), unloading 35 and check/packing 36.

In the job shop line (existing line 40), the steps of dicing, die bonding and clean cure (not shown) are performed, which is followed by the steps of wire bonding 37, mold preparation 31, molding 32 and coating 33.

Shown here is an example that the step of coating 33 in the flagship line 1 is carried out for every three lots which have underwent the step of molding 32. On the other hand, in the job shop line (existing line 40), coating 33 is carried out for every lot.

As shown in FIG. 7, after molding 32 is carried out for three lots (first to third lots) in the flagship line 1, coating 33 is carried out for them; if the schedule should not be changed, the step of coating 33 in the flagship line 1 would overlap the step of coating 33 in the concurrently ongoing job shop line, at point P.

Therefore, about two hours before completion of molding on the third lot in the flagship line 1, the host computer 19 sends an instruction to change the time of coating 33 in the job shop line (existing line 40) from point P to point Q, to the coating apparatus 3.

Similarly, the time of coating 33 is changed from point R to point S.

In this way, the process start support system 18 in this embodiment allows the whole facility to work efficiently with priority on the serial processing line, without a decline in the operation rates of the processing apparatuses.

Thus, even if a need to deal with an unscheduled product arises, serial processing for the unscheduled product may be preferentially performed by the first serial processing apparatus 8 and second serial processing apparatus 13.

In the example shown in FIG. 7, the time required to carry out the process from die bonding to wire bonding for one lot in the existing line 40 is substantially shortened by the use of the flagship line 1.

This is because the time and labor required to make a connection between independent processing apparatuses are saved by using the first serial processing apparatus 8 and second serial processing apparatus 13, and the nine wire bonders 7 in the first serial processing apparatus 8 run concurrently.

Because of an unscheduled product or an apparatus failure, the initial schedule may have to be updated (rescheduling).

An instruction for rescheduling is sent before wafer loading or wire bonding for each diffusion lot (ten assembly lots) or for each assembly lot.

For an apparatus like the coating apparatus 3 which tends to fail frequently, the flagship line 1 may be designed to include preventive maintenance in which the apparatus is inspected according to prediction of an apparatus failure cycle.

Specifically, it is possible that the failure cycle of each processing apparatus is predicted and instructions to systematically stop each apparatus and make it offline according to the prediction may be sent from the host computer 19 to the apparatuses beforehand in order to manufacture semiconductor devices without a decline in the operation rates of the apparatuses.

Consequently, in the flagship line 1 according to this embodiment, the possibility of a stagnant flow of workpieces between steps is minimized and the time required for each step is substantially shortened.

In a conventional manufacturing line which consists of standalone apparatuses each having a loader unit 14 and an unloader unit 15, each processing apparatus is more expensive and more installation space is required, which means a higher cost and a larger processing facility.

By contrast, in the flagship line 1 according to this embodiment, the number of loader units 15 and unloader units 15 for each apparatus can be decreased by using a plurality of serial processing apparatuses (in this example, the first serial processing apparatus 8 and second serial processing apparatus 13) and thus the initial investment cost can be reduced.

The use of serial processing apparatuses makes the entire facility compact and improves space productivity.

Thus, a low cost space-saving facility can be realized.

In the conventional manufacturing facility, which products come next is unknown at each step and a certain number of products have to be accumulated before proceeding to the next step. On the other hand, in the process start support system 18 based on the flagship line 1 according to this embodiment, the flow of products is monitored so that which products are in which step and in what condition are grasped and instructions are given appropriately to prepare for the start of a process. Hence, the process start time can be appropriately determined and initial setup for product type change can be made in a timely manner.

As a consequence, the possibility of a stagnant flow of products in each step is minimized and the processing time can be substantially shortened.

One preferred embodiment of the invention which has been made by the present inventor has been concretely explained so far. However, the invention is not limited to the above embodiment; obviously it may be embodied in any other form without departing the spirit and scope thereof.

For example, although the flagship line 1 runs concurrently with the existing line 40 in the above embodiment, the flagship line may run independently.

Also, the above embodiment assumes that the semiconductor device to be manufactured is QFP 20, but it may be any other semiconductor device as far as it can be assembled by the flagship line 1 described above in connection with the above embodiment.

Furthermore, although the flagship line 1 is configured for the later stage of the entire semiconductor device manufacturing process (from dicing to visual inspection) in the above embodiment, instead the invention may be applied to processing apparatuses for the earlier stage and the flagship line 1 may be configured for the early stage.

INDUSTRIAL APPLICABILITY

As discussed so far, the semiconductor device manufacturing method according to the present invention is suitable for a semiconductor device manufacturing line using a serial processing apparatus which performs a series of steps sequentially and particularly suitable for a manufacturing line which combines plural standalone processing apparatuses and serial processing apparatuses.

What is claimed is:

1. A method of manufacturing a semiconductor device having a manufacturing sequence comprising:
   a flow shop process of sequentially performing a series of plural different steps; and
   a job shop process of providing a plurality of processing apparatuses of a kind and concurrently performing processing of different conditions,
   wherein, in a process in said manufacturing sequence, either said flow shop process or said job shop process or both are performed, and said manufacturing sequence combines said flow shop process and said job shop process,
   wherein a serial processing apparatus performs a series of plural different steps in said flow shop process, and
   wherein said serial processing apparatus sequentially performs die bonding, clean cure and wire bonding.

2. A method of manufacturing a semiconductor device having a manufacturing sequence comprising:
   a flow shop process of sequentially performing a series of plural different steps; and
   a job shop process of providing a plurality of processing apparatuses of a kind and concurrently performing processing of different conditions,
   wherein, in a process in said manufacturing sequence, either said flow shop process or said job shop process or both are performed, and said manufacturing sequence combines said flow shop process and said job shop process;
   wherein a serial processing apparatus performs a series of plural different steps in said flow shop process, and
   wherein said serial processing apparatus sequentially performs marking, cutting, testing and visual inspection.

3. A method of manufacturing a semiconductor device having a manufacturing sequence comprising:
   a flow shop process of sequentially performing a series of plural different steps; and
   a job shop process of providing a plurality of processing apparatuses of a kind and concurrently performing processing of different conditions,
   wherein, in a process in said manufacturing sequence, either said flow shop process or said job shop process or both are performed, and said manufacturing sequence combines said flow shop process and said job shop process, and
   wherein said manufacturing sequence uses two different types of serial processing apparatuses and three different types of job shop process apparatuses, and one of said two serial processing apparatuses as a first serial processing apparatus performs die bonding, clean cure, and wire bonding and the other as a second serial processing apparatus performs marking, cutting, testing and visual inspection, and said three job processing apparatuses respectively perform dicing, molding, and coating.

4. The method of manufacturing a semiconductor device according to claim 3,
   wherein a number of wire bonders in said first serial processing apparatus is varied depending on a number of external terminals of said semiconductor device.

5. The method of manufacturing a semiconductor device according to claim 1, wherein data from a main process in said manufacturing sequence is sent to a control device and according to this data, instructions for a product for which a manufacturing process is to be started are sent from said control device to processing apparatuses in said main process in said manufacturing sequence.

6. The method of manufacturing a semiconductor device according to claim 1, wherein a loader unit is provided at a joint between said flow shop process and said job shop process and, when a workpiece is transferred between said flow shop process and said job shop process, said workpiece is moved into said loader unit.

7. The method of manufacturing a semiconductor device according to claim 2, wherein data from a main process in said manufacturing sequence is sent to a control device and according to this data, instructions for a product for which a manufacturing process is to be started are sent front said control device to processing apparatuses in said main process in said manufacturing sequence.

8. The method of manufacturing a semiconductor device according to claim 2, wherein a loader unit is provided at a joint between said flow shop process and said job shop process and, when a workpiece is transferred between said flow shop process and said job shop process, said workpiece is moved into said loader unit.

9. The method of manufacturing a semiconductor device according to claim 3, wherein data from a main process in said manufacturing sequence is sent to a control device and according to this data, instructions for a product for which a manufacturing process is to be started are sent from said control device to processing apparatuses in said main process in said manufacturing sequence.

10. The method of manufacturing a semiconductor device according to claim 3, wherein a loader unit is provided at a joint between said flow shop process and said job shop process and, when a workpiece is transferred between said flow shop process and said job shop process, said workpiece is moved into said loader unit.

* * * * *